(12) United States Patent
Huang

(10) Patent No.: US 7,408,832 B2
(45) Date of Patent: Aug. 5, 2008

(54) MEMORY CONTROL METHOD AND APPARATUSES

(75) Inventor: Hsiang-I Huang, Hsinchu (TW)

(73) Assignee: MediaTek Inc., Taipei (TW)

( * ) Notice: Subject to any disclaimer, the term of this patent is extended or adjusted under 35 U.S.C. 154(b) by 157 days.

(21) Appl. No.: 11/385,190

(22) Filed: Mar. 21, 2006

(65) Prior Publication Data

US 2007/0247953 A1  Oct. 25, 2007

(51) Int. Cl.
 *G11C 8/00* (2006.01)
(52) U.S. Cl. .............................. 365/230.03; 365/189.07; 365/203; 365/233.1
(58) Field of Classification Search ............ 365/189.07, 365/203, 230.03, 233.1
 See application file for complete search history.

(56) References Cited

U.S. PATENT DOCUMENTS

| | | | |
|---|---|---|---|
| 6,510,097 B2 * | 1/2003 | Fukuyama | 365/230.03 |
| 6,665,224 B1 * | 12/2003 | Lehmann et al. | 365/222 |
| 6,826,115 B2 * | 11/2004 | Lee et al. | 365/238.5 |
| 6,891,393 B2 * | 5/2005 | Sugamoto et al. | 324/765 |
| 7,072,228 B2 * | 7/2006 | Takahashi | 365/189.05 |

* cited by examiner

*Primary Examiner*—Hoai V Ho
(74) *Attorney, Agent, or Firm*—Thomas, Kayden, Horstemeyer & Risley

(57) ABSTRACT

A memory control method, a memory controller, and a memory device implementing the method are provided. The memory controller controls the memory device comprising a plurality of banks, and a first row in a bank is activated for access. The memory controller receives a request for access of a second row in the bank and delivers a special command to the memory device. The memory device deactivates the first row and activates the second row upon receipt of the special command.

10 Claims, 6 Drawing Sheets

MEMORY CONTROL METHOD AND APPARATUSES

BACKGROUND OF THE INVENTION

1. Field of the Invention

The invention relates to memory device, and in particular, to a control method for synchronous dynamic random access memory (SDRAM).

2. Description of the Related Art

FIG. 1a shows a conventional memory control timing sequence. In a SDRAM, a memory controller receives data access requests such as requests for reading/writing a specific address, and delivers corresponding commands to a memory device storing the requested data. A memory device typically comprises four or eight banks. A bank is a storage array formed by rows and columns with data bits stored therein. In each bank, only one row can be activated at a specific time, therefore, at most a total of eight rows are simultaneously activated in a memory device comprising eight banks. To active a row in a bank, the memory controller delivers an ACTIVE command to the memory device through a command bus comprising CS/RAS/CAS/WE wires, with the row address delivered through an address bus simultaneously. An activation typically consumes three clock cycles. After the row activation, the memory device delivers a READ/WRITE command to access the data according to a column address delivered through the address bus at the same time. The accessed row remains activated until another row in the same bank is requested for access. A PRECHARGE command is utilized to deactivate the first row before activating the second row, which typically consumes three clock cycles.

As shown in FIG. 1a, a plurality of commands are delivered through the command bus RAS/CAS/WE sequentially, with corresponding row addresses and column addresses delivered through an address bus. At time T1, a PRECHARGE command 110 is delivered to deactivate a first row in a bank BA0. In the meantime, a don't care signal 100 is delivered through the address bus. Thereafter, at time T4, an ACTIVE command 112 is delivered to activate a second row in the bank BA0, with a second row address 116 delivered through the address bus. At time T7, a READ command 114 is delivered to read a column in the activated row of the bank BA0, with the column address 118 delivered through the address bus. At time T8, another PRECHARGE command 120 deactivates a third row in bank BA1, and similarly, the corresponding ACTIVE command 122 and READ command 124 are delivered at time T11 and T14 to read data from the bank BA1. In this way, a command bus consumes fourteen cycle times to deliver six commands in which eight cycle times are idle, thus the bus utility is inefficient.

FIG. 1b shows another conventional memory command timing sequence. The bus utility is enhanced by interleaving different bank commands to avoid idle states. The PRECHARGE command 120 for bank BA1 is delivered at time T2, and the PRECHARGE command 130 for bank BA2 is delivered at time T3. Similarly, times T5 and T6 deliver ACTIVE commands for banks BA1 and BA2, and times T8 and T9 deliver READ commands for banks BA1 and BA2. In this way, the bus is fully utilized during time T1 to T9. At time T10, however, the access for a bank BA3 still comprise idle cycle times, for example, T11, T12, T14, and T15 in FIG. 1b. Thus, at most three banks (BA0, BA1 and BA2) can be accessed in succession.

FIG. 2 is a flowchart of conventional memory control. In step 202, the memory controller is initialized by receiving data access requests. In step 204, the memory controller determines whether the bank containing the requested data is activated. If not, the process proceeds to step 206 to activate the bank and perform a read/write operation in step 214. If the bank is activated in step 204, the process proceeds to step 208 to determine whether the requested row is same as the previously activated row. If yes, The read/write operation is directly performed in step 214. If not, the process proceeds to step 210 to send a PRECHARGE command to deactivate the previously activated row, and then send an ACTIVE command to activate the currently requested row in step 212 followed by step 214. The memory control operation ends with step 216.

In this way, a previously activated row must be deactivated before activating a currently requested row in the same bank, thus two commands are required to complete the operation, a PRECHARGE command for the previously activated row and an ACTIVE command for the currently requested row.

BRIEF SUMMARY OF THE INVENTION

An exemplary embodiment of a memory control method is provided. A memory controller controls a memory device comprising a plurality of banks, and a first row in a bank is activated for access. The memory controller receives a request for access of a second row in the bank and delivers a special command to the memory device. The memory device deactivates the first row and activates the second row upon receipt of the special command.

The memory controller and the memory device are coupled by a command bus and an address bus. The special command is transferred through the command bus, and the second row address is synchronously transferred through the address bus with the delivery of the special command.

Upon receipt of the special command, the memory device deactivates the first row in the bank. Three clock cycles after the first row deactivation, the memory device activates the second row in the bank.

A memory controller implementing the memory control method is also provided. The memory controller comprises an address table, a control logic and a command generator. The address table records all activated row addresses in each bank, including the first row address. The control logic enables a special command when receiving a request for access of a second row in the first bank. The command generator delivers the special command to the memory device when enabled. The memory device deactivates the first row and activates the second row in the first bank when receiving the special command.

The memory device implementing the memory control method is also provided, comprising a plurality of banks, and a command decoder decoding command signals delivered from the memory controller. When access to a second row in the first bank is requested, the memory controller delivers a special command to the command decoder, and the memory device deactivates the first row and activates the second row in the first bank accordingly.

BRIEF DESCRIPTION OF THE DRAWINGS

The following detailed description, given by way of example and not intended to limit the invention solely to the embodiments described herein, will best be understood in conjunction with the accompanying drawings, in which.

DETAILED DESCRIPTION OF THE INVENTION

A detailed description of the invention is provided in the following.

Figure 1A:
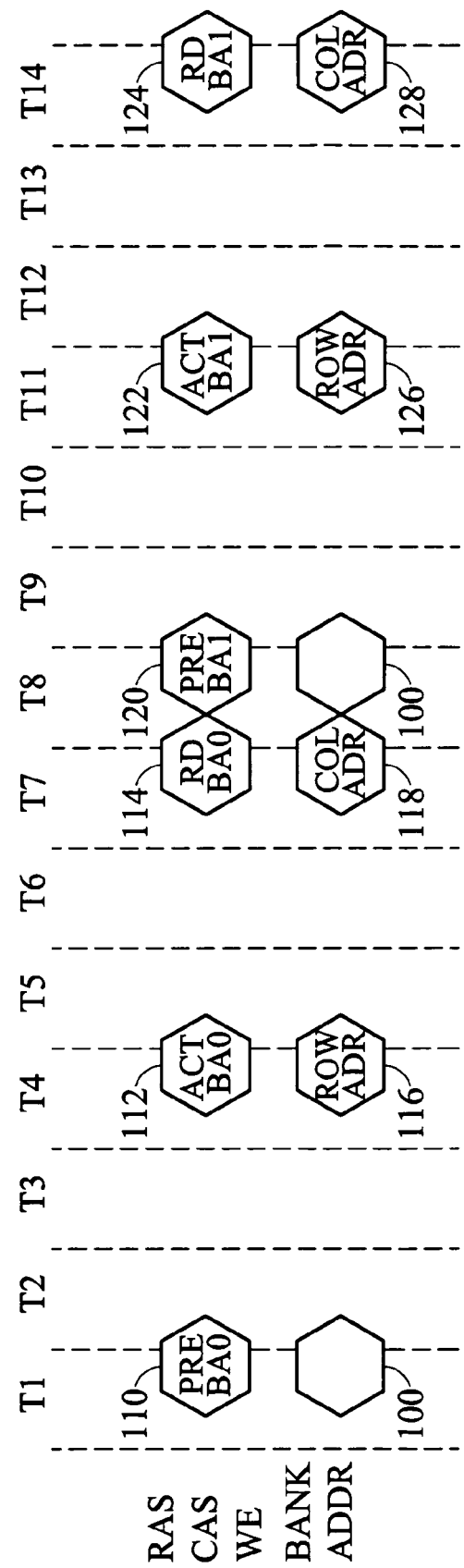
FIG. 1a shows a conventional memory control timing sequence.
Figure 1B:
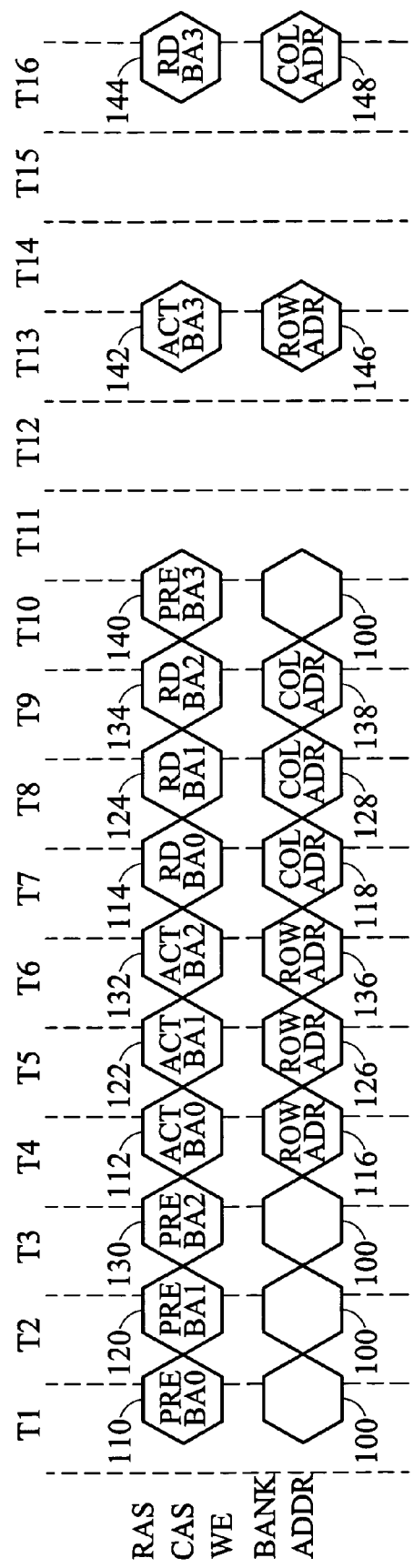
FIG. 1b shows another conventional memory command timing sequence.
Figure 2:
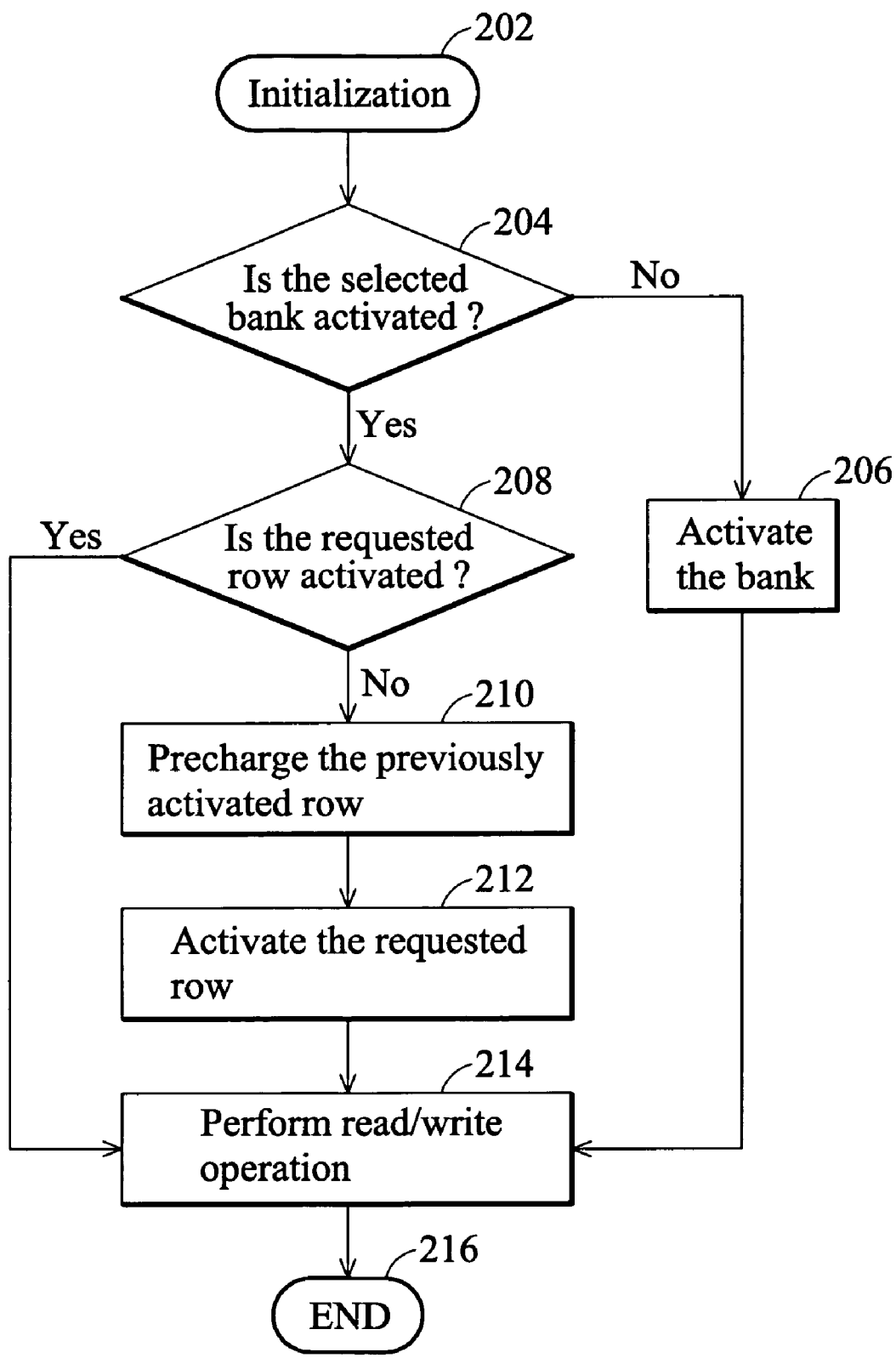
FIG. 2 is a flowchart of conventional memory control.
Figure 3:
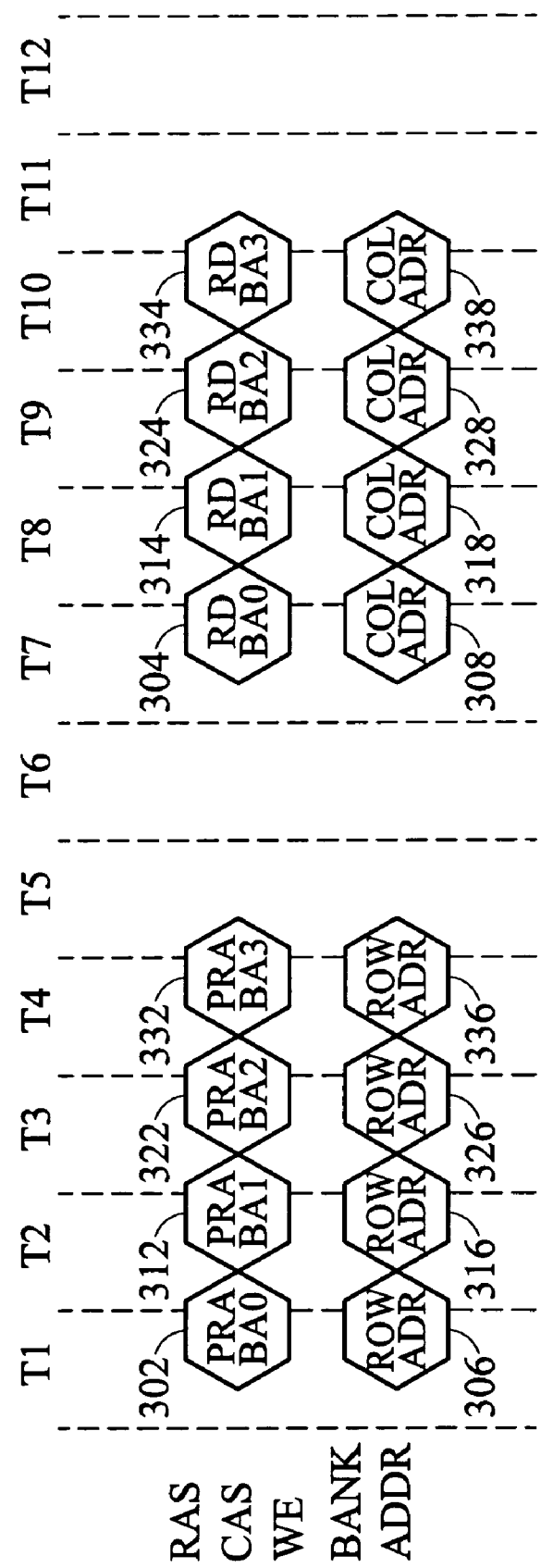
FIG. 3 shows an embodiment of the memory control timing sequence.

FIG. 3 shows an embodiment of the memory control timing sequence. Conventionally in one bank, a PRECHARGE command for the previously activated row and an ACTIVE command for the currently requested row are required when the two rows are different. In the invention, a special command is provided to operate equivalently as combination of the two conventional commands, thus the utility of command bus can be reduced. As shown in FIG. 3, the special command is referred to as a "PRECHARGE with ACTIVE" command PRA. For example, in time T1, a PRA command 302 for bank BA0 is delivered with a row address 306, thus the bank BA0 is acknowledged to deactivate the previously activated row therein, and activate the currently requested row according to the row address 306. In this embodiment, a PRA command utilizes the command bus one cycle time, and requires six wait times for the memory device to complete the corresponding operation. Six cycle times later, in time T7, when the row in the bank BA0 is ready, a READ command 304 with column address 308 is delivered to perform the read operation in the activated row of bank BA0. The memory controller makes use of the remaining cycle times to access other banks. For example, at Time T2 and T8, a PRA command 312 and READ command 314 are delivered to access bank BA1, time T3 and T9 for bank BA2, and time T4 and T10 for bank BA3. In this way, at maximum of six banks can be successively accessed within 12 cycle times T1 to T12 whereas a conventional method has at most only three banks accessed in the same situation.

Figure 4:
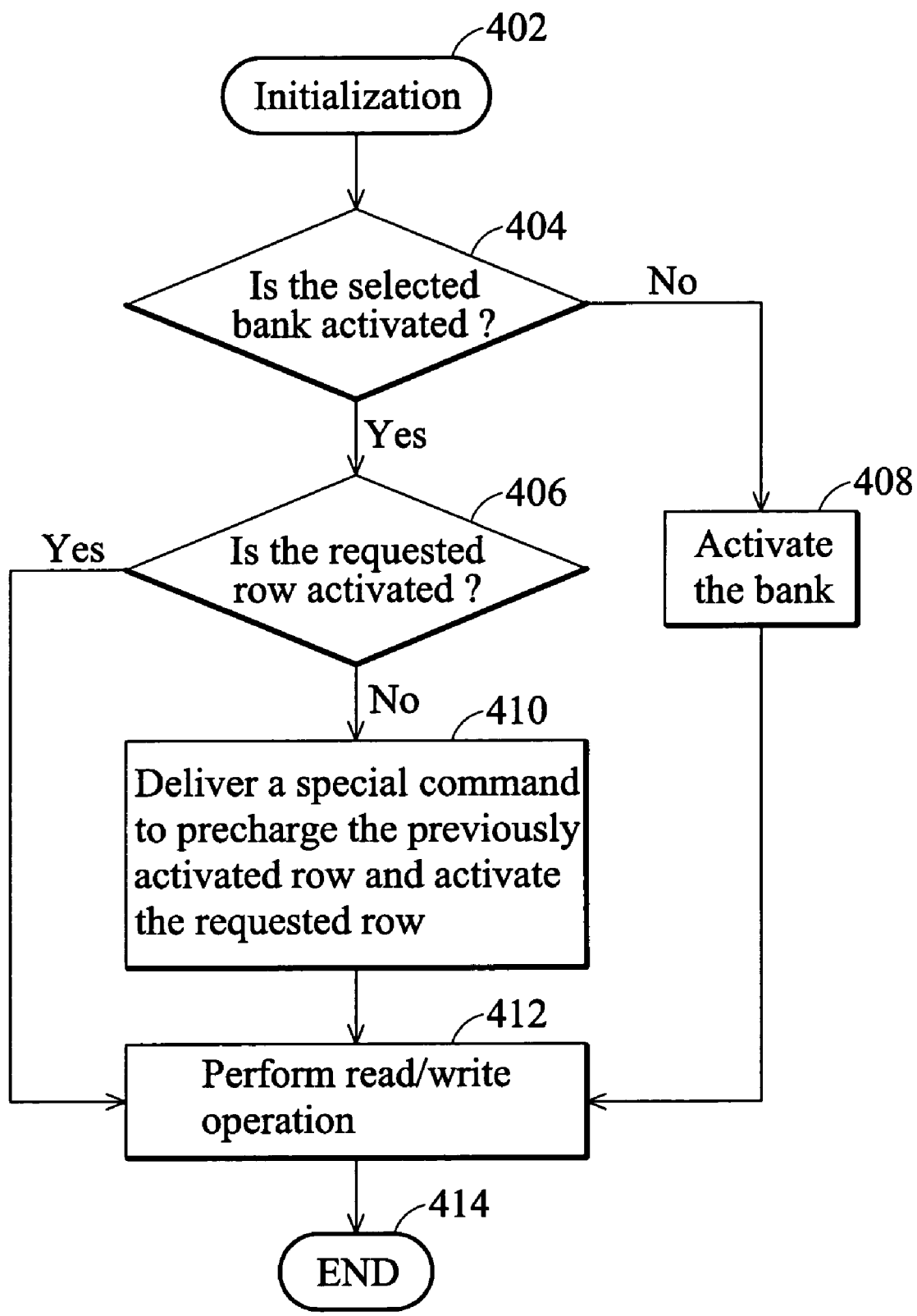
FIG. 4 is an exemplary flowchart of the memory control.

FIG. 4 is an exemplary flowchart of the memory control. In step 402, the memory controller is initialized by receiving data access requests. In step 404, the memory controller determines whether the bank containing the requested data is activated. If not, the process proceeds to step 408 to activate the bank and performs a read/write operation in step 412. If the bank is activated in step 404, step 406 determines whether the requested row is same to the previously activated row. If yes, a read/write operation is directly performed in step 412. If not, step 410 sends a special command to the memory device. Six cycle times later, after the previously activated row is deactivated and the currently requested row is activated, step 412 is proceeded. The memory control operation ends in step 414.

Figure 5:
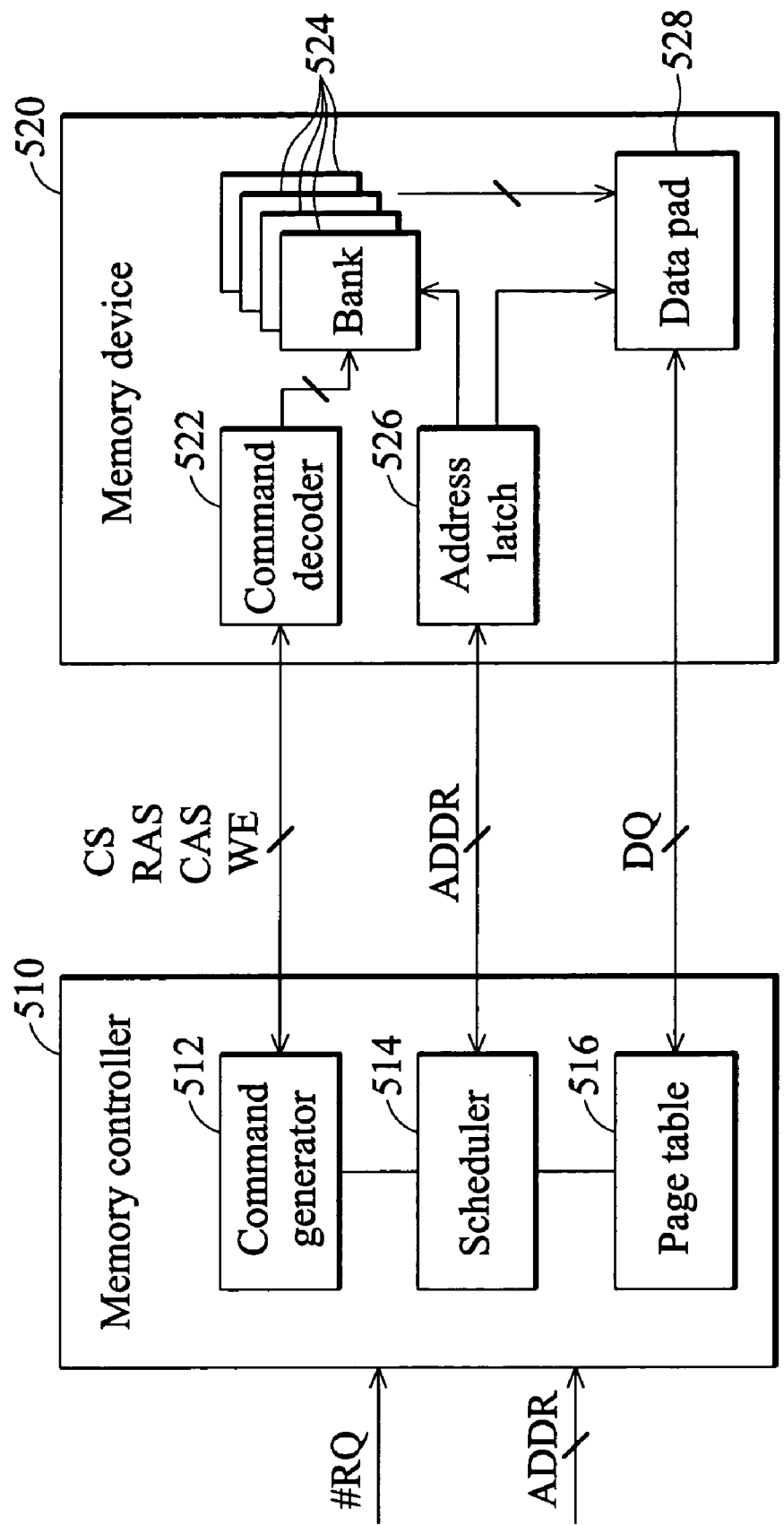
FIG. 5 shows an exemplary memory system according to the invention.

FIG. 5 shows an exemplary memory system according to the invention. The memory system comprises a memory controller 510 and a memory device 520. The memory controller 510 comprises a command generator 512, a scheduler 514 and a page table 516. Data requests corresponding to a specific address are sent to the memory controller 510, and in response, data DQ is obtained from the memory device 520 under the access control provided by the memory controller 510. The memory device 520 comprises four or eight banks 524, and the page table 516 in the memory controller 510 keeps a record of the bank statuses, registering every currently activated row. The scheduler 514 determines which command to deliver based on the page table 516 and the data requests, respectively generating a control signal to the command generator 512. The command generator 512 accordingly generates and delivers the command to the memory device 520 via the command bus CS/RAS/CAS/WE, along with corresponding addresses delivered through the address bus. The commands comprise conventional READ, WRITE, REFRESH, PRECHARGE, ACTIVE, and the special command proposed in the invention, PRECHARGE with ACTIVE. The special command is delivered when the bank status and data request meet the condition that a currently requested row for a bank is different from the previously activated row in the same bank.

The memory device 520 also comprises a command decoder 522, an address latch 526 and a data pad 528. The command decoder 522 receives the commands delivered from the command generator 512, and send corresponding control signal to the banks 524. The address latch 526 is coupled to the memory device via the address bus, receiving addresses sent along with the commands for operations in the banks 524. The data pad 528 operates as an input/output port for the banks 524, controlled by a bank selection signal sent from the address latch 526 to sent/receive data. The command decoder 522 is capable of recognizing the special command to perform equivalent operation as a combination of the conventional PRECHARGE and ACTIVE commands. Upon receipt of the special command, the command decoder 522 sends a control signal to deactivate the previously activated row in the selected bank. Three clock cycles after the previous row deactivation, the command decoder 522 sends another control signal to activate the requested row in the same bank. Through the command decoder 522, the activation and deactivation in the banks 524 are not different from conventional operations, thus, benefits of full compatibility are realized.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A memory control method for a memory controller controlling a memory device comprising a plurality of banks, wherein a first row in a bank is activated for access, the method comprising:

the memory controller delivering a special command to the memory device upon receipt of a request for access of a second row in the bank, the special command directing the memory device to deactivate the first row and activate the second row; and the memory device deactivating the first row and activating the second row according to the special command; wherein delivery of the special command consumes one clock cycle; wherein the first row and the second row are different rows.

2. The memory control method as claimed in claim 1, wherein:

the memory controller and the memory device are coupled by a command bus and an address bus;

the special command is transferred through the command bus; and the second row address is synchronously transferred through the address bus with the delivery of the special command.

3. The memory control method as claimed in claim 1, further comprising:

upon receipt of the special command, the memory device deactivating the first row in the bank; and three clock cycles after the first row deactivation, the memory device activating the second row in the bank as directed by the special command.

4. A memory controller, controlling a memory device comprising a plurality of banks, wherein a first row in a first bank is activated for access, the memory controller comprising:

an address table, recording all activated row addresses in each bank, including the first row address;

a control logic, enabling a special command when receiving a request for access of a second row in the first bank, wherein the special command directs the memory device to deactivate the first row and activate the second row; and a command generator, delivering the special command to the memory device when enabled;

wherein the memory device deactivates the first row and activates the second row in the first bank according to the special command and delivery of the special command consumes one clock cycle.

5. The memory controller as claimed in claim 4, wherein:

the control logic compares the first row address and the second row address corresponding to the first bank; and if the first row address and the second row address are different, enables the special command designated to deactivate the first bank and activate the second bank.

6. The memory controller as claimed in claim 4, wherein:

the memory controller and the memory device are coupled by a command bus and an address bus;

the special command is transferred through the command bus; and the second row address is synchronously transferred through the address bus with the delivery of the special command.

7. The memory controller as claimed in claim 4, wherein:

upon receipt of the special command, the memory device deactivates the first row; and three clock cycles after the first row deactivation, the memory device activates the second row as directed by the special command.

8. A memory device, controlled by a memory controller, comprising:

a plurality of banks, wherein a first row in a first bank is activated for access;

a command decoder, decoding command signals delivered from the memory controller; wherein:

when access to a second row in the first bank is requested, the memory controller delivers a special command to the command decoder, wherein the special command directs the memory device to deactivate the first row and activate the second row, wherein the first row and the second row are different rows;

the memory device deactivates the first row and activates the second row in the first bank accordingly according to the special command; and delivery of the special command consumes one clock cycle.

9. The memory device as claimed in claim 8, wherein:

the memory controller and the memory device are coupled by a command bus and an address bus;

the special command is transferred through the command bus; and the second row address is synchronously transferred through the address bus with the delivery of the special command.

10. The memory device as claimed in claim 8, wherein:

upon receipt of the special command, the memory device deactivates the first row; and three clock cycles after the first row deactivation, the memory device activates the second row as directed by the special command.

* * * * *